US011780771B2

(12) United States Patent
Park et al.

(10) Patent No.: US 11,780,771 B2
(45) Date of Patent: Oct. 10, 2023

(54) FLEXIBLE COVER WINDOW HAVING FOLDING PART AND MANUFACTURING METHOD OF SAME

(71) Applicant: UTI INC., Chungcheongnam-do (KR)

(72) Inventors: Deok Young Park, Gyeonggi-do (KR); Jae Young Hwang, Gyeonggi-do (KR); Hak Chul Kim, Chungcheongnam-do (KR); Kukhyun Sunwoo, Gyeonggi-do (KR); Tea Joo Ha, Chungcheongnam-do (KR)

(73) Assignee: UTI INC.

( * ) Notice: Subject to any disclaimer, the term of this patent is extended or adjusted under 35 U.S.C. 154(b) by 417 days.

(21) Appl. No.: 16/892,196

(22) Filed: Jun. 3, 2020

(65) Prior Publication Data

US 2020/0392038 A1    Dec. 17, 2020

(30) Foreign Application Priority Data

Jun. 12, 2019    (KR) .................. 10-2019-0069051

(51) Int. Cl.
*C03C 21/00*    (2006.01)
*C03C 17/32*    (2006.01)
*C03C 15/00*    (2006.01)
*C03C 19/00*    (2006.01)
*H05K 5/03*    (2006.01)
*H05K 5/00*    (2006.01)
*H04M 1/02*    (2006.01)

(52) U.S. Cl.
CPC ............ *C03C 21/002* (2013.01); *C03C 15/00* (2013.01); *C03C 17/32* (2013.01); *C03C 19/00* (2013.01); *H04M 1/0268* (2013.01); *H05K 5/0017* (2013.01); *H05K 5/03* (2013.01)

(58) Field of Classification Search
CPC ....... C03C 21/002; C03C 15/00; C03C 17/32; C03C 19/00; H05K 5/0017; H05K 5/03
See application file for complete search history.

(56) References Cited

U.S. PATENT DOCUMENTS

| 2015/0210588 | A1* | 7/2015 | Chang .................. H05K 1/0306 428/220 |
| 2018/0217639 | A1 | 8/2018 | Jones et al. |
| 2018/0364759 | A1* | 12/2018 | Ahn ...................... G06F 1/1652 |

FOREIGN PATENT DOCUMENTS

KR    10-2018-0079093 A    7/2018
WO    WO-2018213267 A1 *    11/2018    ........... C03B 23/023

* cited by examiner

*Primary Examiner* — David Sample
*Assistant Examiner* — Donald M Flores, Jr.
(74) *Attorney, Agent, or Firm* — Mendelsohn Dunleavy, P.C.

(57) ABSTRACT

Proposed is a flexible cover window having a folding part, the cover window being a glass-based cover window for a flexible display and including: a plane part provided by corresponding to a plane area of the display, and a folding part provided by continuing to the plane part, by corresponding to a folding area of the display, and by being slimmed to be thinner than the plane part, wherein a depth of layer (DOL) of the plane part is larger than a depth of layer (DOL) of the folding part.

25 Claims, 4 Drawing Sheets

CS: 400 MPa

| Case | A/C zone 100um | | | B zone 30um | | |
|---|---|---|---|---|---|---|
| | CS (MPa) | DOL (um) | CT (MPa) | CS (MPa) | DOL (um) | CT (MPa) |
| #1 | 400 | 5 | 22 | 400 | 5 | 100 |
| #2 | 400 | 7.5 | 35 | 400 | 7.5 | 200 |
| #3 | 400 | 10 | 50 | 400 | 10 | 400 |
| #4 | 400 | 12.5 | 67 | 400 | 12.5 | 1,000 |

FIG. 3

CS: 500 MPa

| Case | A/C zone 100um | | | B zone 30um | | |
|---|---|---|---|---|---|---|
| | CS (MPa) | DOL (um) | CT (MPa) | CS (MPa) | DOL (um) | CT (MPa) |
| #1 | 500 | 5 | 28 | 500 | 5 | 125 |
| #2 | 500 | 7.5 | 44 | 500 | 7.5 | 250 |
| #3 | 500 | 10 | 63 | 500 | 10 | 500 |
| #4 | 500 | 12.5 | 83 | 500 | 12.5 | 1,250 |

FIG. 4

CS: 500 MPa

| Case | A/C zone 100um | | | B zone 30um | | |
|---|---|---|---|---|---|---|
| | CS (MPa) | DOL (um) | CT (MPa) | CS (MPa) | DOL (um) | CT (MPa) |
| #1 | 500 | 5 | 28 | 500 | 5 | 125 |
| #2 | 500 | 7.5 | 44 | 500 | 7.5 | 250 |
| #3 | 500 | 10 | 63 | 500 | 10 | 500 |
| #4 | 500 | 12.5 | 83 | 500 | 12.5 | 1,250 |

FIG. 5

CS: 600 MPa

| Case | A/C zone 100um ||| B zone 30um |||
|---|---|---|---|---|---|---|
| | CS (MPa) | DOL (um) | CT (MPa) | CS (MPa) | DOL (um) | CT (MPa) |
| #1 | 600 | 5 | 33 | 600 | 5 | 150 |
| #2 | 600 | 7.5 | 53 | 600 | 7.5 | 300 |
| #3 | 600 | 10 | 75 | 600 | 10 | 600 |
| #4 | 600 | 12.5 | 100 | 600 | 12.5 | 1,500 |

FIG. 6

CS: 700 MPa

| Case | A/C zone 100um ||| B zone 30um |||
|---|---|---|---|---|---|---|
| | CS (MPa) | DOL (um) | CT (MPa) | CS (MPa) | DOL (um) | CT (MPa) |
| #1 | 700 | 5 | 39 | 700 | 5 | 175 |
| #2 | 700 | 7.5 | 62 | 700 | 7.5 | 350 |
| #3 | 700 | 10 | 88 | 700 | 10 | 700 |
| #4 | 700 | 12.5 | 117 | 700 | 12.5 | 1,750 |

FIG. 7

CS: 800 MPa

| Case | A/C zone 100um ||| B zone 30um |||
|---|---|---|---|---|---|---|
| | CS (MPa) | DOL (um) | CT (MPa) | CS (MPa) | DOL (um) | CT (MPa) |
| #1 | 800 | 5 | 44 | 800 | 5 | 200 |
| #2 | 800 | 7.5 | 71 | 800 | 7.5 | 400 |
| #3 | 800 | 10 | 100 | 800 | 10 | 800 |
| #4 | 800 | 12.5 | 133 | 800 | 12.5 | 2,000 |

| Case | A/C zone 100um | | | B zone 30um | | |
|---|---|---|---|---|---|---|
| | CS (MPa) | DOL (um) | CT (MPa) | CS (MPa) | DOL (um) | CT (MPa) |
| #1 | 400 | 20 | 133 | 400 | 6 | 133 |
| #2 | 500 | 18 | 141 | 500 | 5.5 | 145 |
| #3 | 600 | 15 | 129 | 600 | 5 | 150 |
| #4 | 700 | 13 | 123 | 700 | 4 | 127 |
| #5 | 400 | 20 | 133 | 500 | 5 | 125 |
| #6 | 500 | 18 | 141 | 400 | 6 | 133 |
| #7 | 600 | 15 | 129 | 700 | 4.5 | 150 |
| #8 | 700 | 13 | 123 | 600 | 5 | 150 |

FLEXIBLE COVER WINDOW HAVING FOLDING PART AND MANUFACTURING METHOD OF SAME

CROSS REFERENCE TO RELATED APPLICATION

The present application claims priority to Korean Patent Application No. 10-2019-0069051, filed Jun. 12, 2019, the entire contents of which is incorporated herein for all purposes by this reference.

BACKGROUND OF THE INVENTION

Field of the Invention

The present invention generally relates to a glass-based cover window and a manufacturing method of the same. More particularly, the present invention relates to a flexible cover window having a folding part and a manufacturing method of the same, wherein the desired strength and folding properties of the cover window are secured.

Description of the Related Art

Recently, electric and electronic technologies have been rapidly developed, and various types of display products are released to meet demands of a new era and various consumer demands. Among them, research on a flexible display in which the screen can be folded and unfolded is active.

The research on the flexible display is being conducted by bending, rolling, and stretching the display, fundamentally starting from folding the display. In addition to a display panel, a cover window protecting the display panel is also required to be formed flexibly.

Such a flexible cover window is required to fundamentally have excellent flexibility, and to have no marks on a folding part and no distortion of image quality even after being repeatedly folded.

The cover window of a conventional flexible display has used a polymer film such as a PI or PET film on a display panel surface.

However, since such a polymer film is weak in mechanical strength, the polymer film serves only to prevent scratches of the display panel and is vulnerable to external impacts. Furthermore, the polymer film has a low transmittance and is known to be relatively expensive.

In addition, in the case of the polymer film, as the number of times the display is folded increases, marks remain on the folding part, which inevitably damages the folding part. For example, the polymer film is pressed or torn during folding limit evaluation (usually 200,000 times).

Recently, a research on a glass-based cover window has been conducted to overcome the limitation of the cover window provided with the polymer film.

The glass-based cover window is required to have basic required physical properties such that folding properties are satisfied, no distortion of a screen occurs, and sufficient strength is secured despite the repeated contact and constant pressure of a touch pen.

To satisfy such strength property of the cover window, glass is required to have at least a predetermined thickness, and to satisfy the folding properties, glass is required to have a predetermined thickness or less. Accordingly, it is necessary to perform research on the optimal thickness and structure of the cover window, in which folding properties are satisfied while satisfying strength properties and no screen distortion occurs.

As a prior art for such a glass-based cover window, there is "Foldable display device" (Korean Patent Application Publication No. 10-2017-0122554), which provides a cover window formed to be thin in a folding part.

The cover window according to the prior art is formed to become thicker as distance from a folding line defined as having the minimum thickness increases.

The cover window of the prior art is difficult to be applied to a lightweight display device since it is rather thick. Since folding properties are required to be improved, the research of providing a thin folding part in a cover window using thin glass to simultaneously improve strength and folding properties is recently being conducted.

Figure 1:
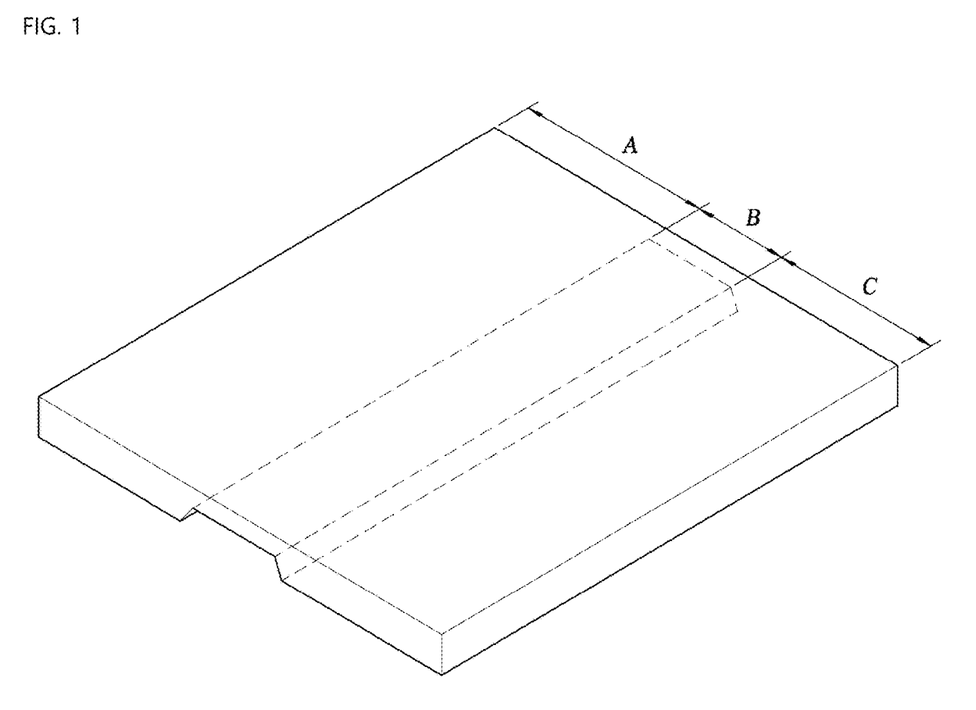
FIG. 1 is a perspective view of a flexible cover window having a folding part according to the present invention.
Figure 2:
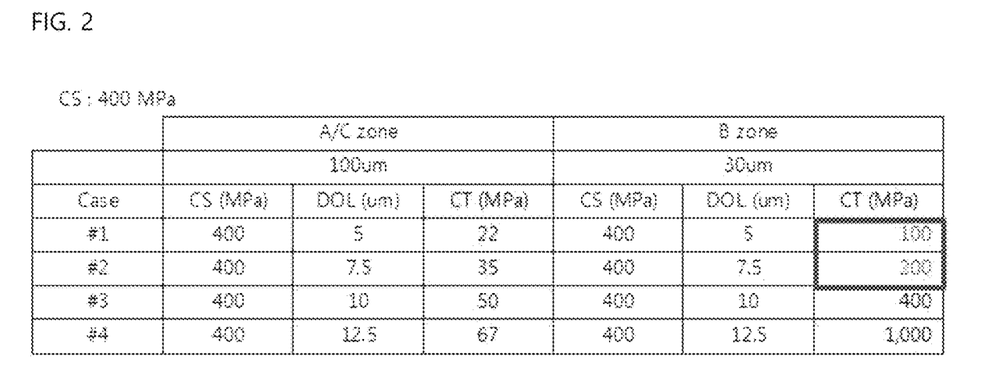
FIGS. 2 to 7 are tables showing the data of measured central tension (CT) values of a plane part and a folding part according to compressive stress (CS) values of a conventional flexible cover window having the folding part.
Figure 3:
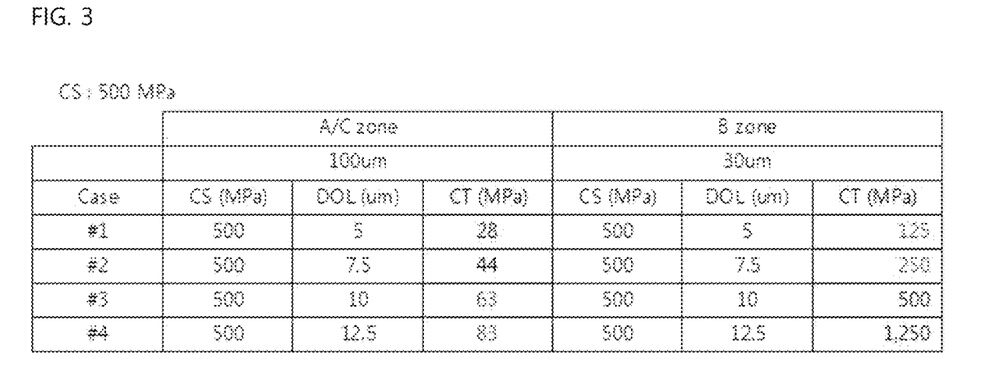
Figure 4:
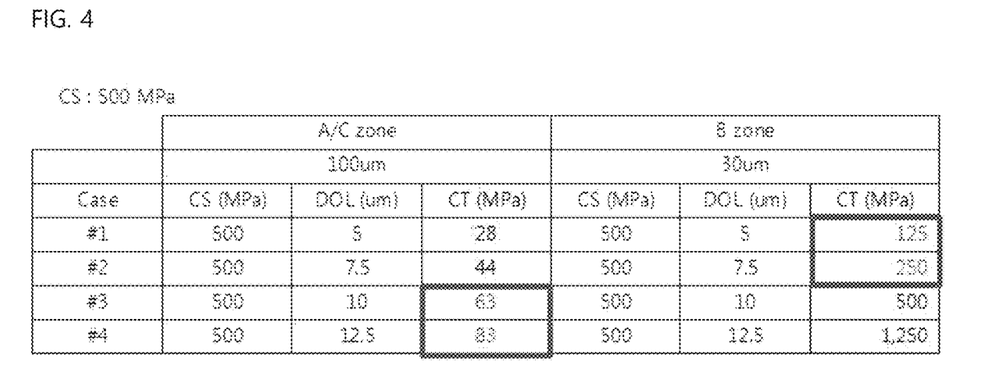
Figure 5:
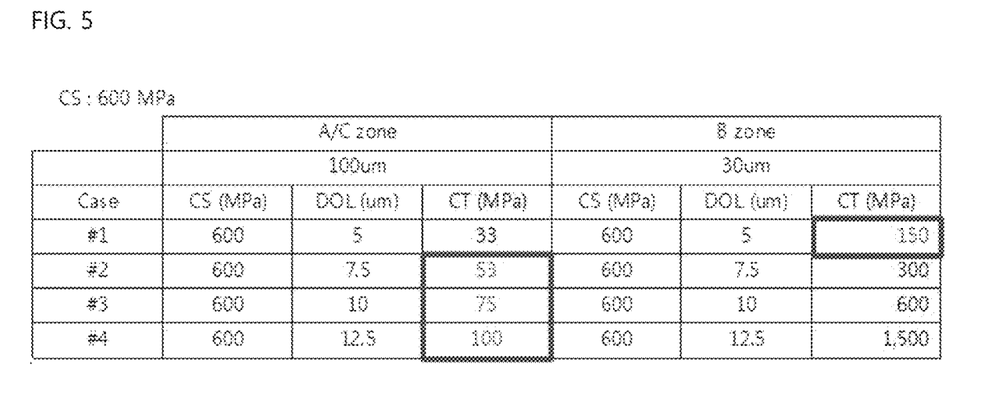
Figure 6:
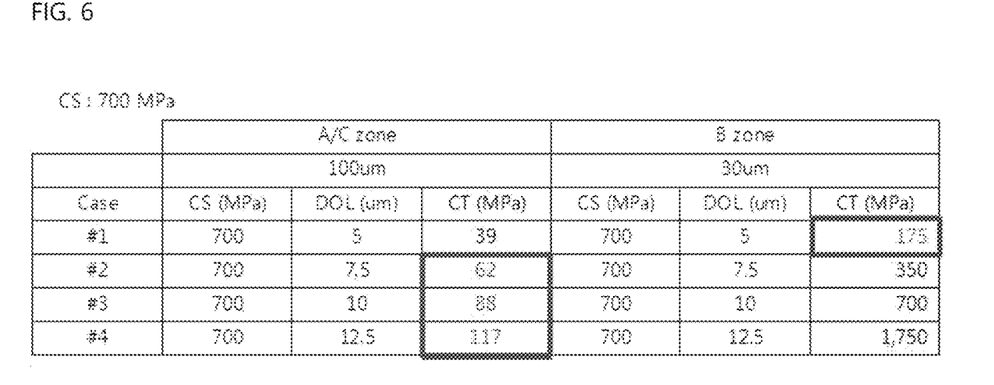
Figure 7:
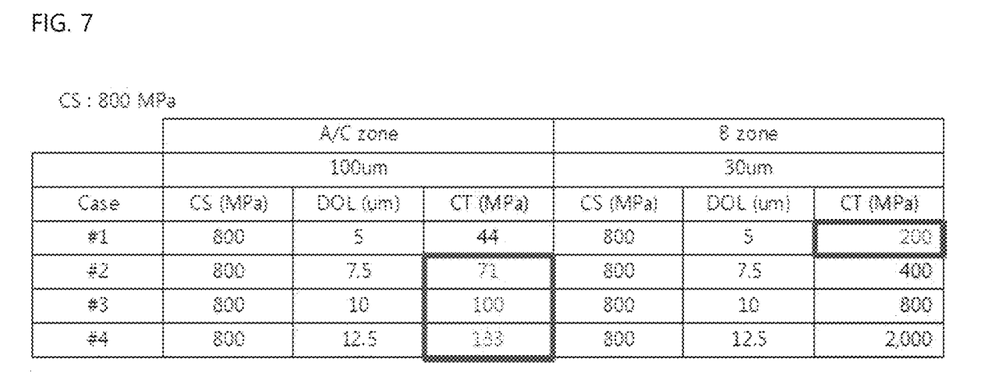

FIG. 1 illustrates the flexible cover window having the folding part, which is thin, in a folding area.

As for such a cover window having the folding part B, the chemical tempering treatment is performed to reinforce basic folding properties and strength, and a central tension (CT) value according to the chemical tempering treatment as a basic required physical property is around 30 MPa to 300 MPa. That is, when the central tension value is less than 30 MPa, folding strength is lacking, and when the central tension value is at least 300 MPa, natural explosion may occur due to high compressive stress (CS).

Generally, in the chemical tempering treatment, the central tension (CT) satisfies the following equation.

$$CT=(CS \times DOL)/(\text{glass thickness}-2 \times DOL)$$

(CS: compressive stress, DOL: depth of layer)

Accordingly, the central tension (CT) is different according to the depth of layer (DOL) and the depth of glass when the compressive stress (CS) is the same.

As illustrated in FIG. 1, as for the cover window having the folding part B, which is thin, the central tension (CT) values of a plane part A and C, and the folding part B are different from each other during the chemical tempering treatment. Accordingly, it is difficult for the plane part A and C, and the folding part B to simultaneously satisfy 30 MPa to 300 MPa which is the basic physical property of the central tension (CT) required for satisfying folding and strength properties.

That is, when the DOL values of the plane part A and C, and the folding part B basically are the same since the chemical tempering treatment is performed in the entire area of the cover window having the folding part B, the central tension (CT) value of the folding part B, which is thin, is higher than the CT value of the plane part A and C.

FIGS. 2 to 7 are tables showing the data of measured central tension (CT) values of the plane part (A/C zone) and a folding part (B zone) according to compressive stress (CS) values of a conventional flexible cover window having the folding part.

As illustrated in the drawings, in the flexible cover window, various conditions of the chemical tempering treatment have been adjusted such that the plane part and the folding part simultaneously satisfy 30 MPa to 300 MPa, which is the basic required physical property of the central tension (CT) value for satisfying folding and strength properties, but the simultaneous satisfaction of the plane part and the folding part was impossible.

Due to high compression ratio in the folding part caused by the imbalance of the central tension (CT) value, the natural explosion, breakage, or waviness of the cover window occurs, leading to serious obstacles to product quality.

Accordingly, as for the thin flexible cover window, a special technique for simultaneously satisfying folding properties and strength properties is required.

SUMMARY OF THE INVENTION

Accordingly, the present invention has been made keeping in mind the above problems occurring in the related art, and the present invention is intended to propose a flexible cover window having a folding part and a manufacturing method of the same, wherein the desired strength and folding properties of the cover window are secured.

In order to achieve the above objective, according to one aspect of the present invention, there is provided a flexible cover window having a folding part, the cover window being a glass-based cover window for a flexible display and including: a plane part provided by corresponding to a plane area of the display, and a folding part provided by continuing to the plane part, by corresponding to a folding area of the display, and by being slimmed to be thinner than the plane part, wherein a depth of layer (DOL) of the plane part is larger than a depth of layer (DOL) of the folding part.

In addition, according to another aspect of the present invention, there is provided a manufacturing method of the flexible cover window having a folding part, the cover window being the glass-based cover window for a flexible display, the method including: firstly forming the plane part provided by corresponding to the plane area of the display, and the folding part provided by continuing to the plane part, by corresponding to the folding area of the display, and by being slimmed to be thinner than the plane part; secondly performing chemical tempering treatment on the plane part and the folding part, or only on the plane part; and thirdly performing an adjustment of depths of layers of the plane part and the folding part such that the depth of layer (DOL) of the plane part is adjusted to be larger than the depth of layer (DOL) of the folding part.

Furthermore, difference between the depths of layers (DOL) of the plane part and the folding part may be at least 2 µm.

Additionally, the adjustment of the depths of layers of the plane part and the folding part may be performed by performing chemical tempering treatment on the plane part and the folding part at the same time, and by additionally performing the chemical tempering treatment on the plane part alone.

In addition, the adjustment of the depths of layers of the plane part and the folding part may be performed by performing chemical tempering treatment on the plane part and the folding part at the same time after performing the chemical tempering treatment on the plane part alone.

Furthermore, the adjustment of the depths of layers of the plane part and the folding part may be performed by etching the folding part after performing chemical tempering treatment on the plane part and the folding part at the same time.

Additionally, the adjustment of the depths of layers of the plane part and the folding part may be performed by a reverse ion exchange process of the folding part after performing chemical tempering treatment on the plane part and the folding part at the same time.

In addition, central tension acting on each of the plane part and the folding part may be adjusted to be 30 to 300 MPa by adjustment of the depths of layers of the plane part and the folding part.

Furthermore, a thickness of the cover window may be 50 to 300 µm, and a thickness of the folding part is 20 to 100 µm.

Additionally, the slimming of the folding part may be performed by any one process of wet etching, polishing, laser forming, and masking processes, by a process of combining the at least two processes thereof, or by the wet etching, the laser forming, or the masking process, which is followed by the polishing process.

In addition, the cover window may satisfy a minimum curvature radius of at least 0.5 mm during folding.

Meanwhile, the folding part may be provided on a surface or opposite surfaces of the cover window, and when the folding part is provided on the opposite surfaces of the cover window, depths of the folding parts may be configured to be the same or different.

Furthermore, the folding part may be filled with a transparent resin material so that the cover window is bonded to a total surface of a display panel without an empty space therebetween. The folding part may be filled with the transparent resin material, and a total surface of the cover window may be continuously coated with the transparent resin material toward an upper side of the folding part.

According to the present invention, the flexible cover window as a glass-based cover window includes the folding part slimmed by corresponding to a folding area of the display, wherein the thickness of the cover window is 50 to 300 µm and the thickness of the folding part is 20 to 100 µm, thereby having excellent strength and folding properties while maintaining the intrinsic texture of glass.

That is, the flexible cover window has high transmittance due to optical properties unique to glass, and can resist scratches and absorb external impact due to the securing of mechanical strength, so that a display panel has excellent visibility and impact resistance.

In addition, the central tension (CT) is balanced and required physical properties are met by adjusting the depth of layer (DOL) of the plane part or the folding part so as to minimize the explosion and breakage of glass and prevent waviness thereof, which are caused by excessive compressive stress (CS) in the folding part, thereby improving production resolution, preventing screen distortion, and minimizing product defects to provide high-quality products.

Additionally, the flexible cover window of the present invention has improved strength and folding properties while being thin and can be used to protect a clear polyimide (CPI) by being disposed thereon.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

The present invention relates to a glass-based cover window. Particularly, the present invention relates to a flexible cover window, wherein the depth of layer (DOL) of a plane part or the depth of layer (DOL) of a folding part is adjusted while maintaining the intrinsic texture of tempered glass, and the central tension of the cover window is adjusted in the entire area of the flexible cover window so as to secure strength and folding properties.

Figure 8:
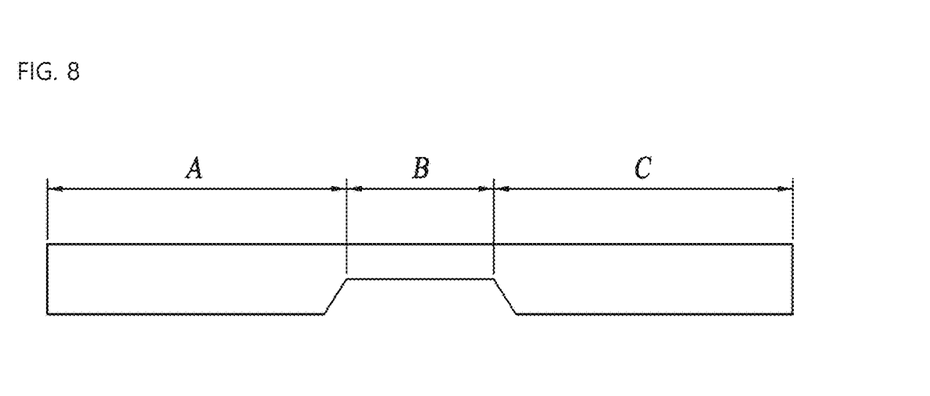
FIGS. 8 and 9 are side views of the flexible cover window having the folding part according to the present invention.
Figure 9:
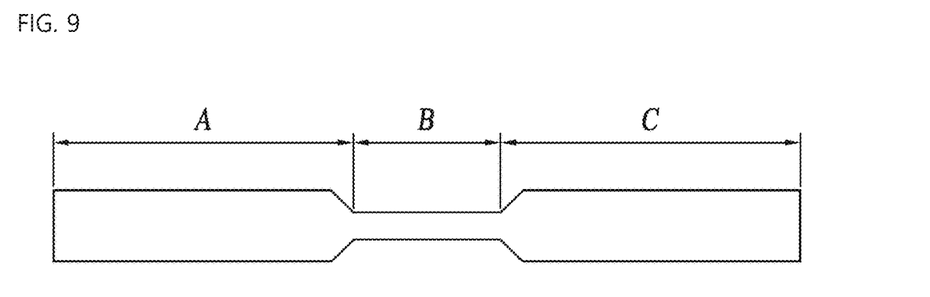

Referring to FIGS. 1, 8, and 9, a cover window for a flexible display according to the present invention, which is a glass-based cover window for a flexible display, includes: the plane part A and C provided by corresponding to a plane area of the display, and the folding part B provided by continuing to the plane part A and C, corresponding to a folding area of the display, and being slimmed to be thinner than the plane part A and C, wherein the reinforcement depth (DOL) of the plane parts A, C is larger than the reinforcement depth (DOL) of the folding part B.

Here, the folding area of the display refers to an area in which the display is folded or bent in half; an area in which the cover window is folded by corresponding to the area is referred to as "a folding area" of the cover window in the present invention; and an area except for the folding area, for convenience, is referred to as the "a plane area" of the cover window.

In the present invention, folding of the display may include in-folding and out-folding, and may be applied to the flexible display in which only the in-folding is performed, or both the in-folding and out-folding are performed.

In the present invention, the thickness of the cover window, that is, the thickness of the plane part A and C is 50 to 300 μm, and the thickness of the folding part B is 20 to 100 μm.

First, the manufacturing method of the flexible cover window having the folding part B according to the present invention includes firstly forming the plane part A and C provided by corresponding to the plane area of the display, and the folding part B provided by continuing to the plane part A and C, by corresponding to the folding area of the display, and by being slimmed to be thinner than the plane part A and C.

Here, as for the folding part B, the folding area of the cover window may be configured to be uniform in thickness, or to gradually increase in thickness toward the outside from the center of the folding part. That is, the folding part B may be configured in the shape of a straight line or a curved line.

The technology of the present invention in which the folding part B is formed in the shape of a straight line has further improved folding properties compared to a conventional technology in which a conventional folding part is formed in a curved shape. When the folding part B has the curved shape, the range of minimum thickness is relatively small. Accordingly, when folding is repeated, the folding properties deteriorates, so breaking occurs at a thick portion during folding. However, when the folding part B is formed to be uniform in entire thickness, that is, is formed in the shape of a straight line to have the same thickness, an area having the minimum thickness is widely formed so as to improve flexibility, resilience, and elasticity, so that the folding properties are improved.

In addition, when the conventional curved folding part B is assembled mechanically, it is not easy to align the center thereof. However, the folding part B according to the present invention is formed to have the uniform thickness. Accordingly, when the folding part B is assembled mechanically, that is, when the cover window is bonded to the total surface of the display panel, assembly tolerances can be reduced, so quality difference between products can be minimized and defect rates can be reduced.

As described above, the folding part B having the shape of a straight line has more advantages than the folding part B having the shape of a curved line. However, the folding part B having the shape of a straight line or the folding part B having the shape of a curved line may be selectively manufactured according to product specifications.

Here, slimming of the folding part is preferably performed by any one process of wet etching, polishing, laser forming, and masking processes, the masking process using a masking ink or a dry film photo resist (DFR), by a process of combining the at least two processes thereof, or by the wet etching, the laser forming, or the masking process, which is followed by the polishing process.

Here, a width of the folding part B is designed in consideration of a curvature radius of the cover window when the cover window is folded, and is roughly set as the curvature radius x π, and the thickness of a cover window positioned in the folding part B is formed to be 20 to 100 μm. The thickness is set by a depth of the folding part B.

When the depth of the folding part B is excessively deep, that is, when the folding area of the cover window is excessively thin, folding properties thereof are good, but wrinkles occur when the cover window is tempered, or strength is decreased in the folding area. However, when the folding area of the cover window is excessively thick, the flexibility, resilience, and elasticity of the folding area are decreased and thus the folding properties are deteriorated. Accordingly, the thickness of the cover window positioned in the folding part B is preferably 20 to 100 μm.

The cover window of the present invention, which is based on glass, is formed to have the thickness of about 50 to 300 μm, and is used after chemical tempering treatment. In the thickness, the width and the depth of the folding part B as described above are properly designed. When the thickness of the cover window is smaller than the thickness described above, the thickness of the folding area of the cover window is excessively thin after the forming of the folding part B, so the above-described problems occur. However, when the thickness of the cover window is larger than the thickness described above, flexibility, resilience, and elasticity thereof are decreased since the cover window is based on glass as described above, and it is difficult to lighten display products.

According to a first embodiment of the present invention, the folding part B is formed in the shape of being slimmed inward in the folding area of the cover window and has the shape of a rectangular trench as a whole. Each of opposite ends of the folding part B may be configured to have thickness of gradually becoming larger from the folding part B and to continue to the plane area of the cover window.

Inclination θ of a boundary part continuing to the plane part A and C from the folding part B preferably has a range of 1 to 50° relative to the folding part B, and more preferably, has a range of 3 to 20°.

That is, according to the embodiment of the present invention, the section of the folding part B is preferably configured in a trapezoidal shape, not a rectangular shape. This is to gradually buffer stress occurring due to thickness difference between the folding area and the plane area of the cover window when folding is repeated. In consideration of this, the inclination of the boundary part is set.

In addition, inclining the boundary part is intended to minimize the visibility of the boundary part caused by light reflection. That is, when no inclination (90°) of the boundary part exists, the reflective surface of the boundary part is visible to naked eye due to the reflection of a side surface of the plane part A and C, causing the distortion or resolution deterioration of a screen. Accordingly, in the present invention, the folding part B and the plane parts A, C are formed to have a gentle inclination to minimize the visibility of the boundary part.

The adjustment of the inclination of the boundary part may be performed with an area adjacent to the boundary part wet by etching solution during slimming of the folding part B, or may be performed by performing the masking process using DFR to avoid close contact at the boundary part of the folding part B such that etching solution partially penetrates below the DFR at the boundary part.

Accordingly, the cover window of the present invention based on glass is formed to have the thickness of about 50 to 300 μm, and is used after the chemical tempering treatment. In the thickness, the thickness of the cover window positioned in the folding part B is formed to be 20 to 100 μm, and the inclination θ of the boundary part is 1 to 50° (preferably, 3 to 20°) relative to the folding part B. This is an optimal design for securing the thickness of the glass such that the intrinsic texture of the tempered glass is maintained and for securing the strength and the folding properties thereof at the same time.

Meanwhile, as illustrated in FIG. 8, the folding part B may be formed on a surface of the cover window, and as illustrated in FIG. 9, the folding part B may be formed on opposite surfaces of the cover window. This is determined by choice according to display product specifications.

Particularly, when the folding part B is provided on the opposite surfaces of the cover window, depths of the folding parts B may be configured to be the same or different. Preferably, the folding part B of a back surface of the cover window may be configured to be deeper. That is, the folding part B of the back surface is formed to be deeper than the folding part B of the front surface of the cover window which a user touches, so the strength and the folding properties are secured and the feeling of physical touch and discomfort of the user are minimized.

In addition, the folding part B of the present invention is filled with a transparent resin material, so that the cover window is bonded to the total surface of the display panel without an empty space therebetween.

That is, the folding part B is filled with the transparent resin material to provide the cover window being uniform in entire thickness, so that there is no empty space (an air layer) when the cover window is bonded to the total surface of the display panel.

As for the conventional cover window, there is a gap (an air layer) between the conventional cover window and the total surface of the display panel. Accordingly, the distortion of image quality due to difference in a refractive index between glass and the air layer, the decrease of touch response speed, and the decrease of bonding strength between the display panel and the cover window relative to the gap occur.

In the present invention, the folding part B is filled with the transparent resin material having a refractive index almost identical to a refractive index (1.5) of glass, so all the above problems can be solved.

The transparent resin material is an optical clear resin (OCR). For example, acrylic, epoxy, silicone, urethane, urethane compound, urethane acryl compound, hybrid sol gel, and siloxane family may be used. The combination of the resin materials is variously performed according to characteristics of the resin materials and can be used for reinforcing strength and elasticity.

Furthermore, when the folding part B is formed on the opposite surfaces of the cover window, the transparent resin material, with which the folding part B of the back surface (a stretching portion) of the cover window is filled, is preferably provided as a material softer than the transparent resin material, with which the folding part B of a front surface (a folded portion) thereof is filled.

The folded portion is formed of a hard material by filling the portion which a user touches with the transparent resin material, which is a relatively hard material, to maintain durability, and the stretching portion is formed of a relatively soft material to minimize cracks at the stretching portion.

In addition, the folding part B is filled with the transparent resin material and the total surface of the cover window may be continuously coated with the transparent resin material toward an upper side of the folding part B.

This is to prevent crack from occurring in the folding area, to minimize the visibility of the shape of the folding part B from the outside, and to secure flatness of a portion in contact with the display panel by allowing the folding part B to be evenly filled with the transparent resin material. Furthermore, the cover window has an elastic force reinforced on a surface in contact with the display panel, thereby having improved impact resistance and the function of preventing the splintering of glass when the glass is broken.

Meanwhile, a functional coating layer may be provided on the surface or the opposite surfaces of the cover window. The functional coating layer is formed of a transparent material such as the transparent resin material described above and has functionality by synthesizing a resin having a variety of properties.

When the folding part B is filled with the transparent resin material or when the folding part and the total surface of the cover window are coated with the transparent resin material, the functional coating layer may be formed on an upper layer thereof. This can be formed by a known resin coating method such as spraying, dipping, and spin coating.

The functional coating layer may be formed in a single layer or multiple layers. The functional coating layer formed on the front surface of the cover window may be embodied as a strength reinforcement layer, and the functional coating layer formed on the back surface of the cover window may be embodied as an elastic reinforcement layer.

That is, since the front surface of the cover window is touched, the functional coating layer having a reinforced strength may be embodied in the front surface. The functional coating layer having a reinforced elasticity may be embodied on the back surface of the cover window to perform buffering between the back surface and the display panel.

The strength reinforcement layer (hard coating) of the front surface of the cover window uses resin having relatively high hardness when the resin is hardened, for example, resin having a high content of resin such as acrylic or epoxy, and the elastic reinforcement layer (soft coating) of the back surface of the cover window uses resin having relatively high elasticity when the resin is hardened, for example, resin having a high content of silicone or urethane synthetic resin. Furthermore, strength or elasticity is reinforced to be used by controlling the content of organic and inorganic materials in organic-inorganic hybrid sol-gel.

In addition, when the functional coating layer provided on the front surface of the cover window is provided in multiple layers, the functional coating layer is preferably formed of a material getting harder upward.

Additionally, the functional coating layer, particularly, a functional coating layer formed on an uppermost layer may be given an anti-finger (AF) or an anti-reflective (AR) function, and may be embodied by synthesizing a resin having such a function or by forming various patterns, for example, patterns such as moth eyes on the functional coating layer.

Accordingly, since the cover window according to the present invention fundamentally uses thin glass, the cover window has the functional coating layer formed additionally thereon to reinforce strength and elasticity, so the cover window can be protected from external impacts or the pressure of a touch pen.

In addition, the functional coating layer further prevents cracking in the folding area, and reinforces the elastic force of the cover window on a surface in contact with the display panel, thereby functioning to improve impact resistance and prevent splintering.

Accordingly, in the flexible cover window having the plane part A and C, and the folding part B, the chemical tempering treatment is performed to secure strength for a thin plate. In this case, the difference of the central tension (CT) occurs due to thickness difference of the plane part A and C, and the folding part B, so the explosion, breakage, or waviness of the cover window may be caused by excessive compressive stress (CS) in the folding part B, thereby causing the resolution deterioration and screen distortion of a product and the fatal defects of the product.

In the present invention, to solve the problems, the depth of layer (DOL) of the plane part A and C, or the folding part B of the cover window is adjusted to minimize difference of the central tension (CT) between the plane part A and C, and the folding part B.

The flexible cover window having the folding part B according to the present invention is primarily subjected to the chemical tempering treatment. In this case, the chemical tempering treatment may be secondly performed on the plane part A and C, and the folding part B at the same time, or only on the plane part A and C according to the adjustment process of the depth of layer followed by the chemical tempering treatment.

Generally, the chemical tempering treatment is referred to as an ion exchange method, and the compressive stress (CS) is generated by exchanging a small ion (Na+) of a glass surface with a large ion (K+), thereby providing high strength. Accordingly, the central tension (CT) corresponding to the compressive stress (CS) is generated inside the glass.

In this case, the depth of penetration of ions from the glass surface, that is, the depth of layer (DOL) is changed according to the condition (time, temperature, and density) of the chemical tempering treatment. Such a depth of layer (DOL) also affects the compressive stress (CS) and the central tension (CT).

Generally, correlation between the compressive stress (CS), the central tension (CT), and the depth of layer (DOL) during the chemical tempering treatment is expressed by the following equation.

$$CT=(CS \times DOL)/(\text{glass thickness}-2 \times DOL)$$

(CS: compressive stress, DOL: depth of layer)

Accordingly, the central tension (CT) is different according to the depth of layer (DOL) and the thickness of glass when the compressive stress (CS) is the same.

As described above, the cover window according to the present invention is characterized in that the plane part A and C, and the slimmed folding part B are formed, and the thickness in the folding area is thin. However, as can be seen from the above correlational equation, difference in the central tension (CT) occurs in the plane part A and C, and the folding part B due to these structural characteristics, resulting in the breakage and waviness of glass due to the imbalance of the central tension (CT) caused by the difference thereof.

In the present invention, to adjust such a central tension (CT), the adjustment process of the depth of layer is thirdly performed. The depth of layer (DOL) of the plane part A and C is adjusted to be larger than the depth of layer (DOL) of the folding part B by the adjustment process of the depth of layer. Particularly, the difference between the depths of layers (DOL) of the plane part A and C, and the folding part B is made to be at least 2 μm by the adjustment process of the depth of layer.

When the difference of the depth of layer (DOL) between the plane part A and C, and the folding part B is smaller than 2 μm, the difference of the central tension caused by the thickness difference between the plane part A and C, and the folding part B is difficult to be overcome. Accordingly, the difference of the depth of layer (DOL) of the plane part A and C, and the folding part B is required to be the minimum 2 μm DOL to minimize the imbalance of the central tension between the plane part A and C, and the folding part B such that the folding and strength properties required by the flexible cover window are simultaneously met.

Hereinafter, various embodiments for adjusting the depth of layer (DOL) of the plane part A and C to be larger than the depth of layer (DOL) of the folding part B according to the adjustment process of the depth of layer according to the present invention will be described.

According to the first embodiment of the present invention, to adjust the depth of layer (DOL) of the plane part A and C, the chemical tempering treatment is performed on the plane part A and C, and the folding part B at the same time, and then the chemical tempering treatment is additionally performed only on the plane part A and C.

That is, to secure strength, the chemical tempering treatment is firstly performed on the entire area of glass including the plane part A and C, and the folding part B, and then the chemical tempering treatment is additionally performed only on the plane part A and C.

The additional chemical tempering treatment of the plane part A and C may be performed by a process such as chemical dipping, chemical slurry, spraying, or pasting.

Accordingly, to minimize the difference of the central tension (CT) caused by the thickness difference of the plane part A and C, and the folding part B after performing the first chemical tempering treatment, the chemical tempering treatment is additionally performed on the plane part A and C to increase the depth of layer (DOL) of the plane part A and C, so the central tension (CT) of the plane part A and C having lower central tension (CT) than the folding part B is adjusted to the level of the central tension (CT) of the folding part B.

Accordingly, the depth of layer (DOL) of the plane part A and C is adjusted, so the plane part A and C, and the folding part B simultaneously satisfy 30 to 300 MPa which is a physical property required for securing the folding and strength properties of the flexible cover window.

According to a second embodiment of the present invention, to adjust the depth of layer (DOL) of the plane part A and C, the chemical tempering treatment is performed only on the plane part A and C, and then the chemical tempering treatment is performed on the plane part A and C, and the folding part B at the same time.

That is, after the chemical tempering treatment is firstly performed only on the plane part A and C to secure strength, the chemical tempering treatment is secondly performed on the entire area of glass including the plane part A and C, and the folding part B.

The first chemical tempering treatment of the plane part A and C may be performed by a process such as chemical dipping, chemical slurry, spraying, or pasting.

Accordingly, after the chemical tempering treatment is firstly performed only on the plane part A and C, the chemical tempering treatment is performed on the plane part A and C, and the folding part B to minimize the difference of the central tension (CT) caused by the thickness difference of the plane part A and C, and the folding part B, so that the depth of layer (DOL) of the plane part A and C is increased. Accordingly, the central tension (CT) of the plane part A and C having the lower central tension (CT) than the folding part B is adjusted to the level of the central tension (CT) of the folding part B.

That is, the depth of layer (DOL) of the plane part A and C according to the present invention is adjusted, so the plane part A and C, and the folding part B simultaneously satisfy 30 to 300 MPa, which is the physical property required for securing the folding and strength properties of the flexible cover window.

In the above embodiment, to make the depth of layer (DOL) of the plane part A and C larger than the depth of layer (DOL) of the folding part B, the plane part A and C is configured to be deeper in the depth of layer (DOL). To this end, the chemical tempering treatment is additionally performed on the plane part A and C. Furthermore, to meet physical properties required according to a glass type, a chemical tempering treatment condition, glass thickness, and product specifications, the chemical tempering treatment of the plane part A and C may be performed several times.

Next, according to a third embodiment of the present invention, to adjust the depth of layer (DOL) of the folding part B, the process of etching the folding part B is performed after chemical tempering treatment is performed on the plane part A and C, and the folding part B at the same time.

That is, after the chemical tempering treatment is firstly performed on the entire area of glass including the plane part A and C, and the folding part B to secure strength, the etching process is performed only on the folding part B.

The etching process on the folding part B may be performed by general physical and chemical etching after the masking process is performed on the plane part A and C.

Accordingly, to minimize the difference of the central tension (CT) caused by the thickness difference of the plane part A and C, and the folding part B by performing the chemical tempering treatment, the compressive stress (CS) and the depth of layer (DOL) of the folding part B are decreased by performing the etching process on the folding part B, so the central tension (CT) of the folding part B having higher central tension (CT) than the plane part A and C is adjusted to the level of the central tension (CT) of the plane part A and C.

That is, the depth of layer (DOL) of the folding part B according to the present invention is adjusted, so the plane part A and C, and the folding part B simultaneously satisfy 30 to 300 MPa which is the physical property required for securing the folding and strength properties of the flexible cover window.

Next, according to a fourth embodiment of the present invention, to adjust the depth of layer (DOL) of the folding part B, the chemical tempering treatment is performed on the plane part A and C, and the folding part B at the same time, and then the reverse ion exchange process of the folding part B is performed.

That is, to secure strength, the chemical tempering treatment is firstly performed on the entire area of glass including the plane part A and C, and the folding part B, and then the reverse ion exchange process of the folding part B alone is performed.

Generally, the small ion (Na+) of a glass surface is exchanged with the large ion (K+) by secondly performing the chemical tempering treatment. The reverse ion exchange process, on the contrary, replaces the ion (K+) with the ion (Na+) again so that the central tension (CT) in the folding part B can be lowered.

The reverse ion exchange process of the folding part B is performed by providing NaNO3, which is a chemical slurry, to the folding part B.

Accordingly, to minimize the difference of the central tension (CT) caused by the thickness difference of the plane part A and C, and the folding part B by firstly performing the chemical tempering treatment, the reverse ion exchange process of the folding part B is performed to decrease the compressive stress (CS) and the depth of layer (DOL) of the folding part B, so the central tension (CT) of the folding part B having a higher central tension (CT) than the plane part A and C is adjusted to the level of the central tension (CT) of the plane part A and C.

That is, due to the reverse ion exchange process of the folding part B according to the present invention, the plane part A and C, and the folding part B simultaneously satisfy 30 to 300 MPa which is the physical property required for securing the folding and strength properties of the flexible cover window.

Figure 10:
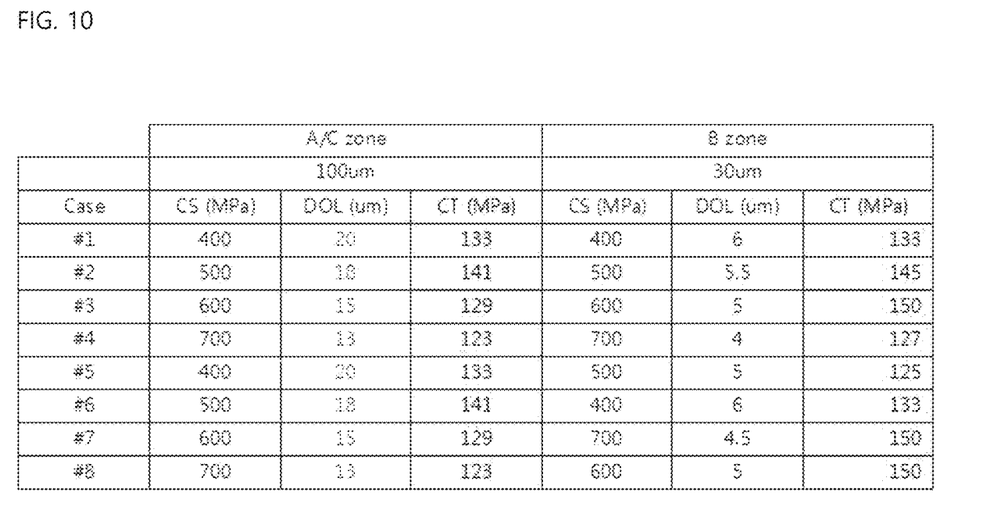
FIG. 10 is a table showing the data of measured central tension (CT) values of the plane part and the folding part according to compressive stress (CS) values of the flexible cover window having the folding part according to the present invention.

FIG. 10 is a table showing the data of measured central tension (CT) values of the plane part and the folding part according to compressive stress (CS) values of the flexible cover window having the folding part according to the embodiment (the first embodiment; the first chemical tempering treatment and the second chemical tempering treatment additionally applied only to the plane part) of the present invention. The plane part and the folding part can be seen to simultaneously satisfy 30 to 300 MPa, which is a physical property required for securing the folding and strength properties of the flexible cover window.

In the flexible cover window having a folding part according to the present invention, strength properties of the plane part A and C are improved by satisfying ball drop and pen drop characteristics therein, and when the folding test is performed 200,000 times in the folding part B, the folding part B meets a 95% pass standard. Accordingly, the depth of layer (DOL) of the plane part A and C or the folding part B is adjusted, and thus the strength and folding properties in the plane part and the folding part are simultaneously satisfied.

As described above, the flexible cover window according to the present invention as a glass-based cover window includes the folding part slimmed by corresponding to the folding area of the display, wherein the thickness of the cover window is 50 to 300 μm and the thickness of the folding part is 20 to 100 μm. The flexible cover window has excellent strength and folding properties while maintaining the intrinsic texture of glass.

In addition, to adjust the depth of layer (DOL) of the plane part or the folding part, tempering of the folding part is performed less than tempering of the plane part; when the compressive stresses (CS) of the plane part and the folding part are the same, the depth of layer (DOL) of the folding part is decreased; or when the compressive stresses (CS) thereof are different, the depth of layer (DOL) of the folding part is properly decreased to balance the central tension (CT) of the plane part and the folding part and to meet the required properties of the flexible cover window.

Accordingly, the central tension (CT) between the plane part and the folding part is balanced, and required physical properties are met so as to minimize the explosion and breakage of glass and prevent waviness thereof, which are caused by excessive compressive stress (CS) in the folding part, thereby improving production resolution and preventing screen distortion, minimizing product defects to provide high-quality products.

In addition, the folding part of the flexible cover window according to the present invention is filled with the transparent resin material to have no gap between the folding part and the total surface of the display panel. Accordingly, the distortion of display image quality can be minimized, and the deterioration of touch response speed and the decrease of bonding strength between the display panel and the cover window can be solved.

Additionally, the flexible cover window of the present invention has improved strength and folding properties while being thin and can be used to protect a clear polyimide (CPI) by being disposed thereon.

What is claimed is:

1. A flexible cover window having a folding part, the flexible cover window being a glass-based flexible cover window for a flexible display and comprising:
    a plane part configured to correspond to a plane area of the display, and
    the folding part configured to correspond to a folding area of the display, and said folding part is thinner than the plane part,
    wherein the plane part has a planar shape and the folding part can be folded and unfolded,
    wherein a reinforcement depth of layer (DOL) of the plane part is larger than a DOL of the folding part, and
    wherein a thickness of the plane part is 50 to 300 μm, and a thickness of the folding part is 20 to 100 μm, and a central tension (CT) acting on each of the plane part and the folding part is adjusted to be 30 to 300 MPa by adjustment of the DOL of the plane part and the DOL of the folding part,
    wherein a compressive stress (CS) of the folding part is the same as a compressive stress (CS) of the plane part.

2. The flexible cover window of claim 1, wherein a difference between the DOL of the plane part and the DOL of the folding part is at least 2 μm.

3. The flexible cover window of claim 1, wherein adjustment of the DOL of the plane part and the DOL of the folding part is performed by performing chemical tempering treatment on the plane part and the folding part at the same time, and by additionally performing the chemical tempering treatment on the plane part alone.

4. The flexible cover window of claim 1, wherein adjustment of the DOL of the plane part and the DOL of the folding part is performed by performing chemical tempering treatment on the plane part and the folding part at the same time after performing the chemical tempering treatment on the plane part alone.

5. The flexible cover window of claim 1, wherein adjustment of the DOL of the plane part and the DOL of the folding part is performed by etching the folding part after performing chemical tempering treatment on the plane part and the folding part at the same time.

6. The flexible cover window of claim 1, wherein adjustment of the DOL of the plane part and the DOL of the folding part is performed by a reverse ion exchange process of the folding part after performing chemical tempering treatment on the plane part and the folding part at the same time.

7. The flexible cover window of claim 1, wherein the folding part is formed in the flexible cover window by any one process of wet etching, polishing, laser forming, and masking processes, by a process of combining the at least two processes thereof, or by the wet etching, the laser forming, or the masking process that is followed by the polishing process.

8. The flexible cover window of claim 1, wherein the flexible cover window satisfies a minimum curvature radius of at least 0.5 mm when folded at the folding part.

9. The flexible cover window of claim 1, wherein the folding part is provided on opposite surfaces of the flexible cover window, and a depth of the folding part on one side of the flexible cover window is configured to be different from a depth of the folding part on the opposite side of the flexible cover window, wherein the depth of the folding part is defined as the distance between a plane of a surface of the folding part and a plane of a surface of the plane part.

10. The flexible cover window of claim 1, wherein a space between a plane of a surface of the folding part and a plane of a surface of the plane part is filled with a transparent resin material and the flexible cover window is configured to be bonded to a total surface of a display panel without said space being empty.

11. The flexible cover window of claim 1, wherein a total surface of the flexible cover window including a surface of the folding part and a surface of the plane part is continuously coated with a transparent resin material.

12. The flexible cover window of claim 1, wherein a boundary part is between the folding part and the plane part, and the boundary part has an angle of inclination θ in a range of 1° to 50° wherein the boundary part is linear and the angle of inclination θ is formed from the boundary part continuing to the plane part from the folding part.

13. The flexible cover window of claim 1, wherein a difference between the DOL of the plane part and DOL of the folding part is at least 2 μm; and the flexible cover window satisfies a minimum curvature radius of at least 0.5 mm when folded at the folding part.

14. A method of manufacturing the flexible cover window of claim 1, the method comprising:
    firstly forming the plane part provided by corresponding to the plane area of the display, and the folding part provided by continuing to the plane part, by corresponding to the folding area of the display, and by being slimmed to be thinner than the plane part;
    secondly performing chemical tempering treatment on the plane part and the folding part, or only on the plane part; and
    thirdly performing an adjustment of depths of layers of the plane part and the folding part such that the depth of layer (DOL) of the plane part is adjusted to be larger than the depth of layer (DOL) of the folding part.

15. The method of claim 14, wherein difference between the depths of layers (DOL) of the plane part and the folding part is at least 2 μm.

16. The method of claim 14, wherein after the chemical tempering treatment is secondly performed on the plane part and the folding part at the same time, the chemical tempering treatment is thirdly and additionally performed only on the plane part to adjust the depth of layer thereof.

17. The method of claim 14, wherein after the chemical tempering treatment is secondly performed only on the plane part, the chemical tempering treatment is thirdly performed on the plane part and the folding part at the same time to adjust the depths of layers thereof.

18. The method of claim 14, wherein after the chemical tempering treatment is secondly performed on the plane part and the folding part at the same time, the folding part is thirdly etched to adjust the depth of layer thereof.

19. The method of claim 14, wherein after the chemical tempering treatment is secondly performed on the plane part and the folding part at the same time, a reverse ion exchange process of the folding part is thirdly performed to adjust the depth of layer thereof.

20. The method of claim 14, wherein the slimming of the folding part is firstly performed by any one process of wet etching, polishing, laser forming, and masking processes, by a process of combining the at least two processes thereof, or by the wet etching, the laser forming, or the masking process that is followed by the polishing process.

21. The method of claim 14, wherein the cover window satisfies a minimum curvature radius of at least 0.5 mm during folding.

22. The method of claim 14, wherein the folding part is provided on a surface or opposite surfaces of the cover window.

23. The method of claim 22, wherein when the folding part is provided on the opposite surfaces of the cover window, depths of the folding parts are configured to be the different.

24. The method of claim 22, wherein the folding part is filled with a transparent resin material so that the cover window is bonded to a total surface of a display panel without an empty space therebetween.

25. The method of claim 24, wherein the folding part is filled with the transparent resin material, and a total surface of the cover window is continuously coated with the transparent resin material toward an upper side of the folding part.

* * * * *